United States Patent [19]

Akashi

[11] Patent Number: 4,550,390
[45] Date of Patent: Oct. 29, 1985

[54] SEMICONDUCTOR MEMORY DEVICE

[75] Inventor: Tsutomu Akashi, Tokyo, Japan

[73] Assignee: Nippon Electric Co., Ltd., Tokyo, Japan

[21] Appl. No.: 366,278

[22] Filed: Apr. 7, 1982

[30] Foreign Application Priority Data

Apr. 8, 1981 [JP] Japan .................... 56/52663

[51] Int. Cl.[4] ............................ G11C 11/40
[52] U.S. Cl. .................... 365/174; 365/189; 365/228
[58] Field of Search ............ 365/174, 179, 189, 228

[56] References Cited

U.S. PATENT DOCUMENTS 4,366,554 12/1982 Aoki et al. .................... 365/174
4,419,745 12/1983 Toyoda .......................... 365/174

Primary Examiner—Terrell W. Fears
Attorney, Agent, or Firm—Sughrue, Mion, Zinn, Macpeak, and Seas

[57] ABSTRACT

A semiconductor memory having a construction making it less susceptible to α-rays. The memory includes a pair of transistors connected in a flip-flop arrangement. In each memory transistor there is a buried region of high concentration which contacts the collector region of the same impurity. The base region consists of a relatively low concentration part, in which the emitter or emitters are formed, and a high concentration part, to which the base electrode is attached. The high concentration part of the base region extends down to and protrudes into the high concentration buried region, resulting in a higher than usual collector-base capacitance. The latter causes the voltage change due to α-rays to be less than it otherwise would be.

8 Claims, 9 Drawing Figures

SEMICONDUCTOR MEMORY DEVICE

BACKGROUND OF THE INVENTION

The present invention relates to a semiconductor memory device, and more particularly to a semiconductor memory device in which a memory circuit is formed of a plurality of bipolar transistors.

In a bipolar RAM integrated circuit, high-density circuit integration and speed-up of operations are more and more advancing in recent years, and a remarkable progress has been achieved. In 1978, however, the problem of the so-called "α-ray soft error" was discovered. The α-ray soft error means errors in the content of the memory storage induced by an α-particle radiated by a minute amount of uranium (U) or thorium (Th) contained in packaging material encasing a semiconductor chip of the integrated memory circuit. Namely, energy of the α-particle emitted by α-decay of uranium or thorium is distributed about a center of 5 MeV, and the maximum energy reaches 9 MeV. Accordingly, an α-particle emitted from a package also could have energy of such order. An alpha-particle of 5 MeV would travel over about 25 $\mu$m through silicon, and during that period they would produce $1.4 \times 10^6$ electron-hole pairs. Especially, if positive holes produced in an N-type collector region arrive at the junction between the N-type collector region and a P-type substrate, then they flow into the substrate as drawn by an electric field within the junction. In addition, electrons produced in the N-type collector region and electrons produced within the substrate which arrive at the collector-substrate junction and have been drawn towards the collector by the electric field within the junction, diffuse through the N-type collector region. As a result, a current flowing from the collector to the substrate is produced. Consequently, in a flip-flop type memory cell employing bipolar transistors, a collector potential of a transistor on the OFF side would be lowered, resulting in inversion of the memory cell flip-flop.

In order to obviate such disadvantages, an improved semiconductor memory device was proposed in U.S. Patent application Ser. No. 247,034 filed by M. Suzuki. In this prior invention it was intended to prevent the aforementioned inversion of memory cell caused by an α-particle by increasing a stray capacitance $C_T$ associated with a node of a collector of a transistor on the OFF side, and according to the prior invention, an additional emitter region of the transistor is provided and it is connected to the collector of the transistor. The capacitance between this additional emitter region and the base region would be connected in parallel to the capacitance between the collector region and the base region, and thereby it was contemplated to increase the overall stray capacitance $C_T$ at the node of the collector by about 20%. However, this proposed structure has a difficulty in that because of the provision of the addition emitter region, the base region is enlarged by the corresponding amount and hence the degree of circuit integration is somewhat sacrificed therefor. Moreover, there exists a device in which even with increase in the stray capacitance $C_T$ of about 20%, the improvement is still not satisfactory.

SUMMARY OF THE INVENTION

It is therefore one object of the present invention to provide a semiconductor memory device having bipolar memory cells which are free from soft errors, especially free from α-ray errors and adapted for high-density circuit integration.

Another object of the present invention is to provide means for increasing a capacitance associated with a collector of a transistor forming a memory cell and enhancing a margin against α-ray soft errors without sacrificing the high-density circuit integration and speed-up of operations through micro-fine patterning.

According to one feature of the present invention, there is provided a semiconductor memory device comprising a semiconductor substrate of one conductivity type, a semiconductor layer of the opposite conductivity type provided on the semiconductor substrate a buried layer of the opposite conductivity type provided between the semiconductor substrate and the semiconductor layer having a higher impurity concentration than the semiconductor layer, a base region of the one conductivity type provided along a major surface of the semiconductor layer, an emitter region of the opposite conductivity type provided within the base region, and a base electrode connected to the base region, the base region including a low concentration portion in which the emitter region being formed, and a high concentration portion to which the base electrode being connected, and the high concentration portion protruding into the buried layer.

According to another feature of the present invention, there is provided a semiconductor memory device comprising a plurality of memory cells arrayed in a matrix form within a memory cell section and having a plurality of first bipolar transistors, and peripheral circuits provided in a peripheral circuit section and having a plurality of second bipolar transistors, each first and second transistor including a base region of one conductivity type and a buried layer of the opposite conductivity type positioned under the base region, a portion of the base region of the first transistor being protruded into the buried layer of the first transistor, and the base region of the second transistor being entirely separated from the buried layer of the second transistor.

According to yet another feature of the present invention, there is provided a semiconductor memory device comprising a semiconductor substrate including a semiconductor base body of one conductivity type, a semiconductor layer of the opposite conductivity type provided on the semiconductor base body and a buried layer of the opposite conductivity type provided between the semiconductor body and the semiconductor layer and having a higher impurity concentration than the semiconductor layer, and a base region of the one conductivity type provided along a major surface of the semiconductor layer, the base region including a center portion and first and second side portions abutting against the center portion, respectively, the center portion being extended from the major surface into the buried layer, the first and second side portions being separated from the buried layer.

The portion of the base region protrudes favorably into the buried layer by 0.1 to 0.4 $\mu$m. Also, the bottom of the portion makes contacts favorably with a part of the buried layer having an impurity concentration of $1 \times 10^{17}$ to $5 \times 10^{18}$/cm$^3$.

According to further feature of the present invention, there is provided a semiconductor memory device comprising a pair of digit lines, a word line, and a memory cell, the memory cell including a first and a second bipolar transistors each having a collector region of one conductivity type, a base region of the opposite conductivity type formed in the collector region, a first emitter region of one conductivity type formed in the base region, a second emitter region of one conductivity type formed in the base region, and a buried layer of one conductivity type positioned under the collector region and having a higher impurity concentration than that of the collector region, first connection means for connecting the collector region of the first transistor to the base region of the second transistor, second connection means for connecting the collector region of the second transistor to the base region of the first transistor, third connection means for connecting the collector region of the first transistor to the word line, fourth connection means for connecting the collector region of the second transistor to the word line, fifth connection means for connecting the first emitter region of the first transistor to one of the pair of digit lines, sixth connection means for connecting the first emitter region of the second transistor to the other of the pair of digit lines, and seventh connection means for connecting the second emitter region of the first transistor to the second emitter region of the second transistor, each base region including a high impurity portion protruding into the buried layer, and a low impurity portion abutting against the high impurity portion and separated from the buried layer.

More particularly, a collector-base junction capacitance $C_{CB}$ is increased by bringing an external base region of a planar type NPN transistor formed in a relatively thin epitaxial silicon layer forming a memory cell section with a high-density N-type buried layer, and thereby a bipolar integrated circuit that is free from α-ray soft errors and that has a high density and a high-speed operation, can be realized. It is obvious that the present invention is equally applicable to a memory cell including PNP transistors in which the respective conductivity types of the regions in the above-described NPN transistor are inverted.

DESCRIPTION OF PREFERRED EMBODIMENTS

Figure 1:
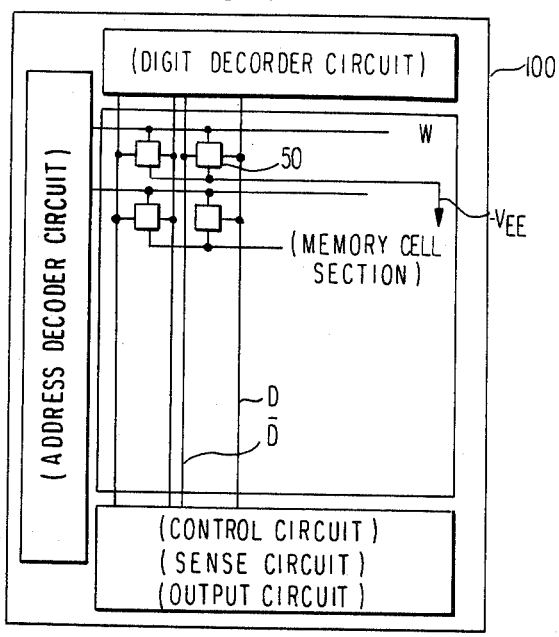
FIG. 1 is a layout diagram showing one example of a semiconductor memory device.

FIG. 1 shows a semiconductor memory device which forms a subject matter of the present invention, in which a memory cell section including a plurality of memory cells 50 arrayed in a matrix form is disposed at the center of a semiconductor chip (device) 100, and around the periphery of the memory cell section is disposed a peripheral circuit section. This peripheral circuit section is composed of an address decoder circuit connected to word lines W, a digit decoder circuit connected to digit lines D and $\overline{D}$, a control circuit, a sense circuit, an output circuit, etc.

Figure 2:
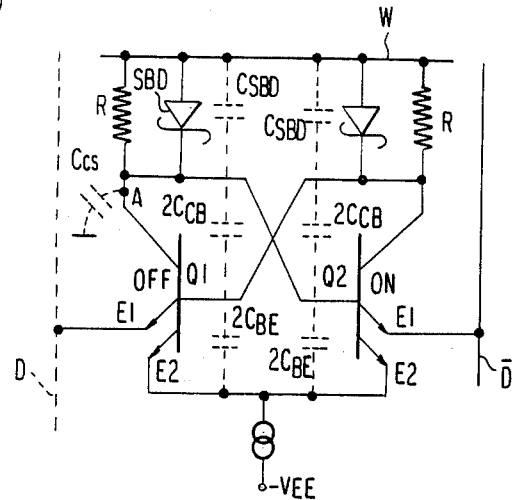
FIG. 2 is a circuit diagram showing one example of a memory cell employing bipolar transistors.

FIG. 2 is a circuit diagram of one memory cell. In FIG. 2, a capacitance $C_T$ associated with a collector node A of a transistor $Q_1$ on the OFF side in the memory cell is represented by $C_T = C_{CS} + C_{SBD} + 4C_{CB} + 2C_{BE}$, where $C_{CS}$ denotes a collector-substrate junction capacitance, $2C_{BE}$ denotes a base-first and second emitter junction capacitance and $C_{SBD}$ denotes a junction capacitance of a Schottky barrier diode SBD. The collector-base capacitance is effectively doubled owing to a mirror effect, moreover since the capacitance of the party transistor is added together, effectively the capacitance becomes $4C_{CB}$. Therefore, the total capacitance $C_T$ associated with the node A of the collector of the memory cell transistor is remarkably influenced by the collector-base capacitance. It is to be noted that in the case where a resistor R is formed of a polycrystalline silicone layer, the capacitance between the resistor and the substrate can be disregarded.

Assuming now that electric charge of electron-hole pairs induced in the proximity of the collector-substrate junction within the memory cell by an α-particle is represented by ΔQ, then the potential charge ΔV at the collector of the transistor $Q_1$ on the OFF side will amount to $\Delta Q/C_T$. Since a hold potential $V_H$ of the memory cell is preset in the neighborhood of 0.3 V, unless the above-mentioned potential change is suppressed to 0.2 V or less, practically due to various fluctuations, inversion of the memory cell would occur. In order to suppress this potential change ΔV, it is only necessary to make the electric charge ΔQ of the electron-hole pairs small or to make the capacitance $C_T$ associated with the collector of the memory cell transistor large. To make the electric charge ΔQ of the electron-hole pairs small, selecting packaging material having a little content of radioactive substance and depositing α-ray shielding material on a semiconductor chip are useful methods. However, the reduction of the electric charge ΔQ is limited in practice, and so, it cannot be perfect measures. On the other hand, the total capacitance $C_T$ can be necessarily increased if the dimensions of the transistors forming the memory cell are enlarged. However, it will conflict with the trends of high-density circuit integration and speed-up of operation which are achieved by micro-fine patterning.

Paying attention to the fact that the collector-base capacitance $C_{CB}$ which is more effective by a factor of four is selectively increased, then margin against α-ray soft errors can be increased. Moreover, the capacitance $4C_{CB}$ and the capacitance $C_{SBD}$ serve as a speed-up capacitance because they are connected in parallel to the load resistance R between the node A in the memory cell and the word line W, it will be readily seen that if these capacitances, especially the collector-base capacitance $C_{CB}$ is selectively increased, then speed-up of operations (improvements in an address access time) simultaneously becomes possible.

Figure 3A:
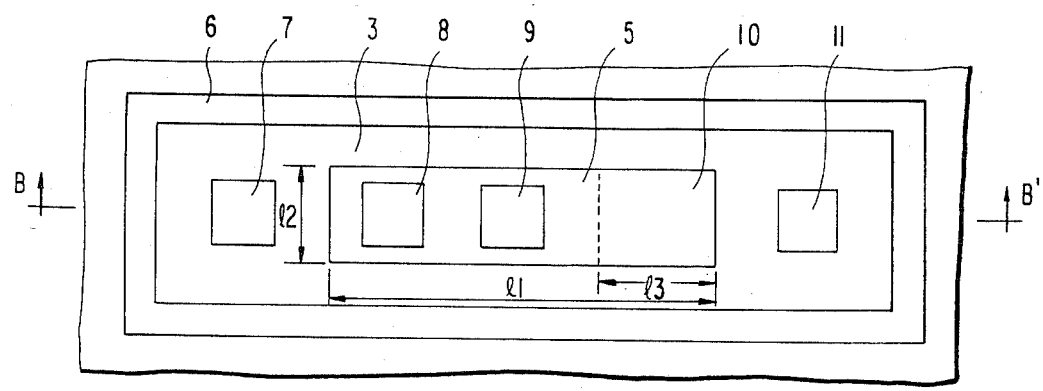
FIG. 3A is a plan view showing a bipolar transistor to be used in a first preferred embodiment of the present invention.
Figure 3B:
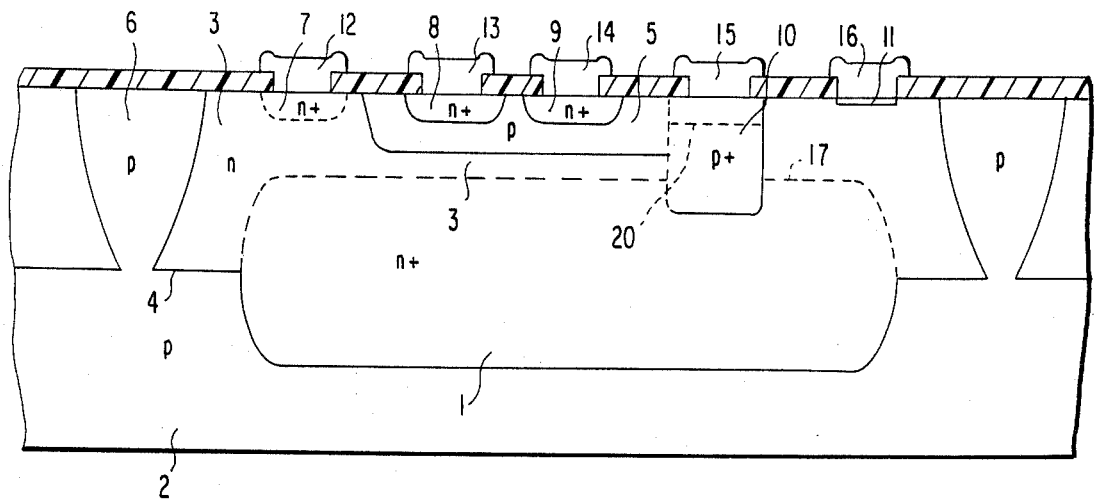
FIG. 3B is an enlarged cross-sectional view taken along line B—B' in FIG. 3A as viewed in the direction of arrows.

FIG. 3 shows a transistor forming a memory cell according to a first preferred embodiment of the present invention, and now the basic feature of the present invention will be described with reference to this figure. The illustrated transistor corresponds to the first transistor $Q_1$ in FIG. 1, and the second transistor $Q_2$ which is omitted from illustration in FIG. 3, also has the same semiconductor structure. With reference to FIG. 3B, and N$^+$-type buried high concentration impurity layer 1 is provided along a boundary surface 4 between a P-type silicon base body 2 and an N-type epitaxial layer 3 of 1.5 $\mu$m in thickness formed on the base body 2. This buried layer 1 protrude from the boundary surface 4 by about 0.8 $\mu$m into the epitaxial layer 3. Within a collector region 3 consisting of the N-type epitaxial layer 3 surrounded by a P-type isolation region 6, are provided an N$^+$-type collector contact region 7 and a P-type base region 5, and within this base region 5 are provided a first emitter region 8 (E$_1$) of N$^+$-type and a second emitter region 9 (E$_2$) of N$^+$-type. In addition, on the surface of the collector region is formed a Schottky barrier diode 11 (SBD). Furthermore, within the P-type base region 5 is provided a P$^+$-type high concentration region 10 characteristic of the present invention so as to extend from the surface of the epitaxial layer up to the upper surface 17 of the N$^+$ buried layer 1 and further embedded into the buried layer 1 by about 0.3 $\mu$m, favorably by 0.1 to 0.4 $\mu$m from the upper surface 17. As shown in FIGS. 3B and 2, a collector electrode 12 making contact with the collector region 7 is connected to a base electrode (not shown) making contact with the base region of the second transistor $Q_2$, a first emitter electrode 13 making contact with the first emitter region 8 is connected to a digit line D, a second emitter electrode 14 making contact with the second emitter region 9 is connected to a similar second emitter electrode (not shown) making contact with the second emitter region of the second transistor $Q_2$, a base electrode 15 making contact with the P$^+$-type high concentration region 10 is connected to a collector electrode (not shown) making contact with the collector region of the second transistor $Q_2$, and an upper electrode 16 of the schottky diode 11 is connected to a word line W. It is to be noted that in FIG. 3A, electrodes are omitted from the illustration.

Now the advantages of the above-mentioned semiconductor structure according to the present invention will be described. At first, let us consider the collector-base capacitance $C_{CB}$ in the prior art structure. In the prior art, since the P$^+$-type region within the base region was used for the purpose of making ohmic contact between the base region and the base electrode, it made no contact with the buried layer 1 and, for instance, it was formed up to the depth indicated by a phantom line 20, shown in FIG. 3B.

Here it is assumed that the length $l_1$ of the base region 5 is 32.5 $\mu$m, its width $l_2$ is 8 $\mu$m, its depth is 0.5 $\mu$m, the impurity concentration of the base region at the bottom surface is $1 \times 10^{16}$/cm$^3$, the impurity concentration in the epitaxial layer 3 is $1 \times 10^{16}$/cm$^3$, the length $l_3$ of the P$^+$-type region 10 for making ohmic contact with the base region is 10 $\mu$m and the impurity concentration of the P$^+$-type region 10 is $1 \times 10^{18}$/cm$^3$.

In the prior art, since P$^+$-type region 10 does not make contact with the buried layer 1, the collector-base capacitance $C_{CB}$ is small. More particularly, under the above-assumed condition, the capacitance along the base bottom surface amounts to $7.8 \times 10^{-2}$ pF, the capacitance along the base side surfaces amounts to $3.4 \times 10^{-2}$ pF, and so, the overall capacitance $C_{CB}$ is equal to $1.12 \times 10^{-1}$ pF.

Whereas, according to the present invention, the P$^+$-type region 10 which was provided for the purpose of making ohmic contact with the base region 5 in the prior art, is brought into contact with the buried layer 1, and further it is projected into the buried layer 1, for instance, by 0.3 $\mu$m from the upper surface 17 of the buried layer. In other words, the P$^+$-type region 10 is extended over 1.0 $\mu$m from the surface of the epitaxial layer 3 to reach the portion of the buried layer 1 having an impurity concentration of $1 \times 10^{18}$/cm$^3$.

In this instance, the capacitance at the portion making contact with the buried layer 1 is $3.84 \times 10^{-1}$ pF, the capacitance along the side surfaces of the P$^+$-type region 10 is $1.44 \times 10^{-2}$ pF, the capacitance along the bottom surface of the P-type base region 5 is $5.4 \times 10^{-2}$ pF, the capacitance along the side surfaces of the P-type base region 5 is $2.12 \times 10^{-2}$ pF, and therefore, the overall capacitance $C_{CB}$ amounts to about $4.74 \times 10^{-1}$ pF. This value is about 4 times as large as the overall capacitance $C_{CB}$ in the prior art.

It is known that a quantity of electric charge produced per unit length of traveling of an $\alpha$-particle is 0.007 pico coulombs. Since an $\alpha$-particle of 5 MeV should travel over about 25 $\mu$m through silicon, the quantity of electric charge $\Delta Q$ produced by such an $\alpha$-particle is calculated to be $\Delta Q = 0.007 \times 25 = 0.175$ pico coulombs. Since a hold voltage of a memory is normally preset in the proximity of 300 mV, unless the potential change caused by traveling of one $\alpha$-particle is suppressed to 200 mV or less, in practice, inversion of a memory would occur.

The overall capacitance $C_T$ at the node A of the collector is, as described previously, represented by $C_T = C_{CS} + C_{SBD} + 4C_{CB} + 2C_{BE}$. Assuming that the whole contact area between the collector and the substrate is about 1000 $\mu$m$^2$, then the collector-substrate capacitance $C_{CS}$ amounts to 0.07 pF. Assuming that an area of one emitter is $5 \times 5$ $\mu$m$^2$, then the base-emitter capacitance $2C_{BE}$ in total amounts to 0.05 pF, and the capacitance $C_{SBD}$ of the Schottky barrier diode SBD amounts to 0.07 pF if its area is assumed to be $10 \times 10$ $\mu$m$^2$. Accordingly, the total capacitance $C_T$ is represented by $C_T = 0.19$ pF $+ 4C_{CB}$ and the potential change $\Delta V$ is represented by the following equation:

$$V = \frac{\Delta Q}{C_T} = \frac{0.175 \text{ (pico coulomb)}}{0.19 + 4 \ C_{CB} \ (pF)}$$

Hence, in the prior art, the potential change $\Delta V$ is as large as $$V = \frac{0.175}{0.19 + 4 \times 0.112} = \frac{0.175}{0.638} \approx 0.27 \ (V),$$

and so, it is difficult to suppress the potential change $\Delta V$ to 0.2 V or less.

Whereas, in the case where the semiconductor structure according to the present invention is employed, the potential change V is as small as $$\Delta V = \frac{0.175}{0.19 + 4 \times 0.474} = \frac{0.175}{2.086} \approx 0.08 \ V,$$

and therefore, the memory would be sufficiently stable even if fluctuations in fabrication are taken into consideration. Thus, according to the present invention, the potential change caused by traveling of an α-particle can be suppressed to a sufficiently small value as compared to the hold voltage of the memory without enlarging the base region, that is, without sacrificing the degree of circuit integration at all, and therefore, a memory cell having a strong α-ray resistivity can be obtained.

In order to form the P+-type high concentration region 10 in the above-described semiconductor structure with good controllability, a P+-type buried layer having a high impurity concentration of, for example, $5 \times 10^{19}/cm^3$ is preliminarily formed in the portion of the N+-type buried layer into which the P+-type region 10 protrudes later. Then, it is favorable to make a P-type impurity diffuse from the top of the epitaxial layer 3 after it has grown to cause the diffused region to connect with the preliminarily provided P+-type buried layer and thus form, as a whole, the P+-type region 10 having an impurity concentration of $10^{18}/cm^3$.

Or else, even though the P+-type buried layer is not preliminarily provided in the above-described manner, if a P-type impurity is introduced only from the top epitaxial layer 3 to a depth of about 0.9 μm at 1000° C. during 30 minutes and thereafter drive-in is effected at 1100° C. for 30 minutes, then the P+-type high concentration region 10 can be formed. In this case, the size of the mask could be determined so as to eventually obtain a predetermined configuration taking into consideration the diffusion of the P-type impurity in the lateral directions.

While the range of an impurity concentration in the portion of the N+-type buried layer which makes contact with the P+-type region 10, is determined depending upon a desired effect of the present invention as well as a desired breakdown voltage between the collector and the base, an impurity concentration in the range of about $1 \times 10^{17}$ to $5 \times 10^{18}/cm^3$ is desirable. In addition, it is desirable for this $P^{30}$-type region 10 to protrude into the N+-type buried layer 1 by 0.1 μm to 0.4 μm from the top surface 17 of the N+-type buried layer 1. If the P+-type region 10 makes contact with the N+-type buried layer 1 in the above-described manner, the collector-base breakdown voltage would become about 10 V. For the transistors within a memory cell, the breakdown voltage of 10 V is quite satisfactory.

Figure 4A:
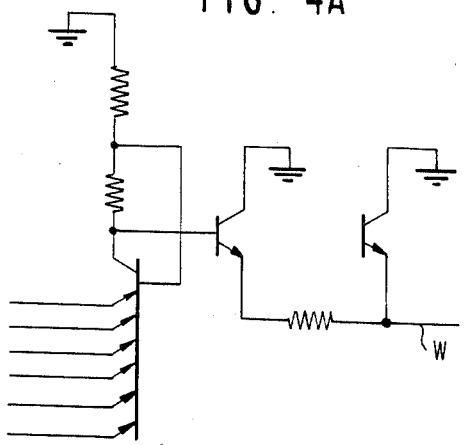
FIG. 4 shows examples of circuitries within a peripheral circuit section, FIG. 4A being circuit diagram showing the portion of an address decoder circuit connected to a word line W, and FIG. 4B being a circuit diagram showing an emitter-coupled logic which is frequently used within a peripheral circuit section.
Figure 4B:
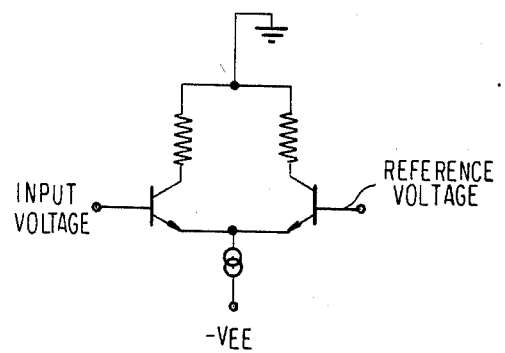
Figure 5:
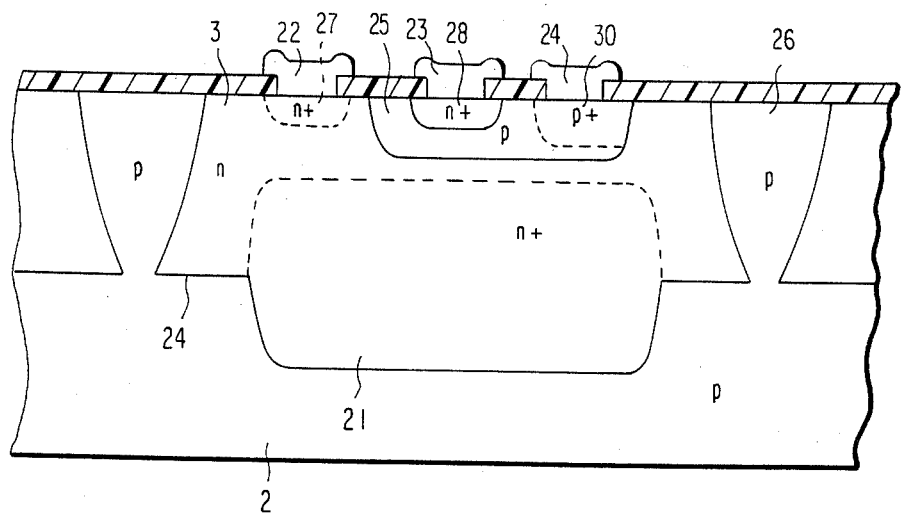
FIG. 5 is an enlarged cross-sectional view showing a bipolar transistor to be used with a peripheral circuit section.

On the other hand, transistors in a peripheral circuit section as illustrated in FIGS. 4A and 4B have a semiconductor structure as shown in FIG. 5. It is to be noted that FIG. 4A shows a portion of an address decoder circuit adapted to be connected to a word line, while FIG. 4B shows an emitter-coupled logic adapted to be used in a peripheral circuit section.

As shown in FIG. 5, in a transistor within a peripheral circuit section, a region of an N-type epitaxial layer 3 surrounded by a P-type isolation region 26 is used as a collector region, and in this N-type collector region 3 are formed an N+-type collector contact region 27 and a P-type base region 25. Within this base region 25 are formed an N+-type emitter region 28 and a P+-type base contact region 30. However, in this transistor within the peripheral circuit section, the P+-type base contact region 30 does not make contact with an N+-type buried layer 21 which protrudes 0.8 μm above a boundary surface 24 between a P-type silicon base body 2 and the N-type epitaxial layer 3. Consequently, the collector-base capacitance $C_{CB}$ is reduced, but the breakdown voltage rises up to 40 V. In addition, electrodes 22, 23 and 24 are connected to the above-mentioned respective regions 27, 28 and 30.

In a peripheral circuit, since an especially high speed of operation is required, it is necessary to minimize surplus capacitances associated with the circuit. A peripheral circuit is not such circuit that the collector-base capacitance $C_{CB}$ is effective as a speed-up capacitance as is the case with the afore-mentioned memory cell circuit. Furthermore, in the case of an emitter-coupled logic as illustrated in FIG. 4B, a potential difference between an input terminal and a reference voltage terminal is as large as 0.5 to 0.8 V, and so, potential change caused by an α particle would not bring about faulty operations of the logic.

Therefore, in a peripheral circuit section, a transistor having the semiconductor structure as shown in FIG. 5 would be desirable.

Figure 6A:
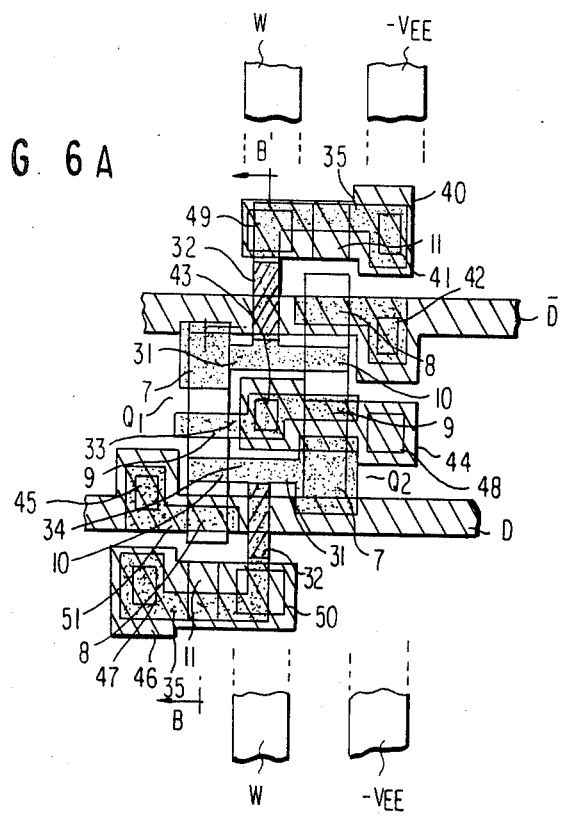
FIG. 6A is a plan view showing a memory cell according to a second preferred embodiment of the present invention.
Figure 6B:
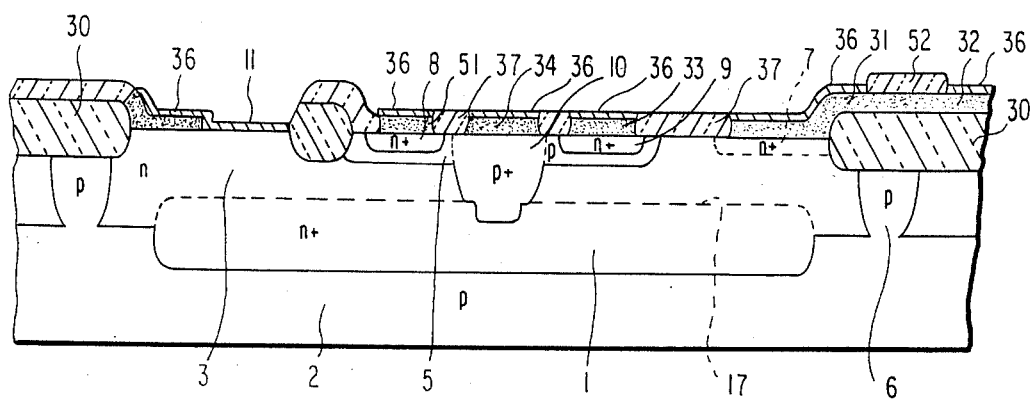
FIG. 6B is an enlarged cross-sectional view taken along line B—B' in FIG. 6A as viewed in the direction of arrows.

FIG. 6A is a plan view of a memory cell according to a second preferred embodiment of the present invention, and FIG. 6B is a cross-sectional view showing a part of the memory cell in an enlarged scale. In order to facilitate understanding of the structure, components having the same functions as those shown in FIGS. 3A and 3B are given like reference numerals. FIG. 6A shows practical realization of the circuit shown in FIG. 2, in which a dotted area indicates a polysilicon layer that forms wirings in the first layer, an area having left-upwardly extending hatching lines indicates an aluminum layer that forms wirings in the second layer and an area having right-upwardly extending hatching lines indicates resistor sections. On a collector contact region 7 of a first transistor $Q_1$ is provided a polysilicon electrode 31 in the first layer, and this polysilicon electrode 31 is connected to a P+-type high concentration region 10 according to the present invention which is provided in a base region of a second transistor $Q_2$, and also connected via a polysilicon resistor 32 to an aluminum wiring 40 in the second layer at a contact portion 41. This wiring layer 40 serves as an upper electrode of a SBD 11 for the second transistor $Q_2$ and connects to a word line W consisting of an aluminum wiring in the third layer at a contact portion 49. A polysilicon wiring 51 connecting to a first emitter region 8 of the first transistor $Q_1$ is connected to a digit line D consisting of an aluminum wiring in the second layer at a contact portion 45, and likewise a first emitter region 8 of the second transistor $Q_2$ is also connected to another digit line $\overline{D}$ at a contact portion 42. Second emitter regions 9 of the first and second transistors $Q_1$ and $Q_2$ are connected to each other through a polysilicon electrode wiring 33. This wiring 33 is connected at a contact portion 43 to an aluminum wiring layer 44, which is in turn connected at a contact portion 48 to a voltage source line $-V_{EE}$ consisting of an aluminum wiring in the third layer. A polysilicon electrode 34 connected to a P+-type high concentration region 10 according to the present invention that is provided in the base region of the first transistor $Q_1$ and a polysilicon electrode 31 connected to a collector contact region of the second transistor $Q_2$ are integrally jointed and connected via a polysilicon resistor 32 to an aluminum wiring 46 in the lower layer at a contact portion 47, and this aluminum wiring 46 serves as an upper electrode of a SBD 11 and is connected at a contact portion 50 to a word line W in the upper aluminum wiring layer.

FIG. 6B shows a cross-section taken along line B—B′ in FIG. 6A in an enlarged scale. It is to be noted that 5 aluminum wirings are omitted from illustration in FIG. 6B. With reference to FIG. 6B, a P-type base region 5 having a low impurity concentration and an N+-type collector contact region 7 are provided within a collector region 3 consisting of an N-type epitaxial layer surrounded by a thick field oxide film 30 that is partly buried in a substrate and a P-type isolation region under the field oxide film 30, and within the P-type base region 5 are formed first and second emitter regions 8 and 9. At a location between the first and second emitter regions 8 and 9, a P+-type high concentration base region 10 characteristic of the present invention extends inwardly from the top surface of the epitaxial layer 3 up to the top boundary surface 17 of an N+-type buried layer 1 and further projects into the buried layer 1. The electrodes in the above-described second preferred embodiment of the present invention are formed through a PSA (polysilicon self-align) process. More particularly, polysilicon is deposited over the entire surface, and by carrying out selective oxidation the polysilicon electrodes 31, 33, 34 and 51 and the oxide film 37 between these electrodes are formed. On the polysilicon electrode wirings is formed platinum silicide 36 for the purpose of lowering their electric resistances, and on the epitaxial layer 3 at the location of the SBD region 11 is also formed platinum silicide. However, a platinum silicide film is not formed on the polysilicon resistor 32 to obtain a predetermined resistance value, but a oxide film 52 is formed thereon.

In the transistors within the peripheral circuit section in the second embodiment, the P+-type high concentration region does not reach the N+-type buried layer as shown in FIG. 5, and the electrodes are formed through the PSA process as shown in FIG. 6B.

As described in detail above, according to the present invention, effective increase of a collector-base junction capacitance of a transistor in a memory cell section can be realized without being accompanied by enlargement of a pattern, hence a margin again α-ray soft errors can be increased, and at the same time the function of the junction capacitance as a speed-up capacitance is also enhanced. If the structure of the integrated circuit according to the present invention is employed jointly with the technique of reducing radioactive substance in a packaging material and employing an effective α-ray shielding material to be deposited on a semi-conductor chip, it is believed possible to realize further improved RAM's in which high density circuit integration as well as speed-up of operations are more and more required in the future. 9n

What is claimed is:

1. A semiconductor memory device comprising a semiconductor substrate of one conductivity type, a semiconductor epitaxial layer of the opposite conductivity type provided on said semiconductor substrate, a first layer of said opposite conductivity type buried between said semiconductor substrate and said semiconductor epitaxial layer and having a higher impurity concentration than said semiconductor epitaxial layer, a first base region of said one conductivity type provided along a major surface of said semiconductor epitaxial layer, the bottom face of said first base region being separated from said first layer, a second base region of said one conductivity type formed in said semiconductor epitaxial layer so as to extend from the surface thereof down to said first layer and to contact with said first base region, said second base region having a higher impurity concentration than said first base region, an emitter region of said opposite conductivity type formed in said first base region, and a base electrode connected to said second base region.

2. A semiconductor memory device as claimed in claim 1, in which said second base region protrudes into said first layer by 0.1 to 0.4 μm.

3. A semiconductor memory device as claimed in claim 1, in which the bottom of said second base region makes contact with a part of said first layer having an impurity concentration of $1 \times 10^{17}$ to $5 \times 10^{18}/cm^3$.

4. A semiconductor memory device comprising a semiconductor body of one conductivity type, a semiconductor layer of the opposite conductivity type provided on said semiconductor body, a buried layer of said opposite conductivity type formed between said semiconductivity body and said semiconductor layer and having a higher impurity concentration than said semiconductor layer, a base region of said one conductivity type provided along a major surface of said semiconductor layer, said base region including a center portion and first and second side portions abutting against said center portion and having a lower impurity concentration than that of said center portion, said center portion being extended from said major surface of said semiconductor layer into said buried layer, said first and second side portions being separated from said buried layer, and a base electrode connected to the surface of said center portion of said base region.

5. A semiconductor memory device as claimed in claim 4, in which said center portion of said base region protrudes into said buried layer by 0.1 to 0.4 μm.

6. A semiconductor memory device as claimed in claim 4, in which the bottom of said center portion of said base region makes contact with a part of said buried layer having an impurity concentration of $1 \times 10^{17}$ to $5 \times 10^{18}/cm^3$.

7. A semiconductor memory device as claimed in claim 4, further comprising first and second emitter regions of said opposite conductivity type provided within said first and second side portions of said base region, respectively.

8. A semiconductor memory device as claimed in claim 4, further comprising a base electrode of silicon connected to said center portion of said base region.

* * * * *

UNITED STATES PATENT AND TRADEMARK OFFICE
CERTIFICATE OF CORRECTION

PATENT NO. : 4,550,390
DATED : October 29, 1985
INVENTOR(S) : Tsutomu AKASHI

It is certified that error appears in the above-identified patent and that said Letters Patent is hereby corrected as shown below:

IN THE SPECIFICATION:

Column 3, line 61, change "with" to --within--.

Column 6, line 61, change "$\approx$" to --$\doteq$--.

Column 7, line 44, change "$p^{30}$" to --$p^{+}$--.

Column 9, line 55, delete "9n".

Signed and Sealed this

Twentieth Day of May 1986

[SEAL]

Attest:

DONALD J. QUIGG

Attesting Officer

Commissioner of Patents and Trademarks